United States Patent [19]

Liaw

[11] Patent Number: 4,962,051
[45] Date of Patent: Oct. 9, 1990

[54] METHOD OF FORMING A DEFECT-FREE SEMICONDUCTOR LAYER ON INSULATOR

[75] Inventor: H. Ming Liaw, Scottsdale, Ariz.

[73] Assignee: Motorola, Inc., Schaumburg, Ill.

[21] Appl. No.: 272,977

[22] Filed: Nov. 18, 1988

[51] Int. Cl.$^5$ .................... H01L 21/265; H01L 21/20
[52] U.S. Cl. .................... 437/26; 148/DIG. 40; 148/DIG. 59; 148/DIG. 72; 148/DIG. 97; 148/33.3; 156/610; 437/62; 437/83; 437/110; 437/126; 437/959; 437/976
[58] Field of Search .................... 148/DIG. 40, 41, 58, 148/59, 72, 77, 81, 97, 118, 127, 150, 159, 160, 33-33.4; 156/610-615; 427/248.1, 252; 437/26, 62, 81, 83, 84, 106, 105, 110, 108, 126, 132, 134, 238, 235, 239, 959, 976

[56] References Cited

U.S. PATENT DOCUMENTS

| | | | |
|---|---|---|---|
| 4,442,449 | 4/1984 | Lehrer et al. | 148/33.1 |
| 4,460,417 | 7/1984 | Murase et al. | 437/162 |
| 4,529,455 | 7/1985 | Bean et al. | 437/110 |
| 4,631,234 | 12/1986 | Larrabee | 156/624 |
| 4,661,829 | 4/1987 | Bean et al. | 357/4 |
| 4,717,681 | 1/1988 | Curran | 437/106 |
| 4,771,013 | 9/1988 | Curran | 437/106 |
| 4,806,502 | 2/1989 | Jorke et al. | 437/106 |

FOREIGN PATENT DOCUMENTS 0213030 10/1985 Japan .
0059836 3/1986 Japan .

OTHER PUBLICATIONS

Manasevit et al., "The Properties of Si/Si$_{1-x}$Ge$_x$ Films Grown on Si by Chemical Vapor Deposition", J. Electron, Mat., vol. 12, No. 4, 1983, pp. 637–650.
Manasevit et al., "Electron Mobility Enhancement in Epitaxial Multilayer Si—Si$_{1-x}$ Ge$_x$ Alloy Films on (100)Si," Appl. Phys. Lett., 41(5). Sep. 1982, pp. 464–466.
People et al., "Modulation Doping in Ge$_x$Si$_{1-x}$Bi Strained Heterostructures", Appl. Phys. Lett. 45(11), Dec. 1984, pp. 1231–1233.
Kasper et al., "A One-Dimensional SiGe Superlattice Grown by UHV Epitaxy", Appl. Phys. vol. 8, 1975, pp. 199–205.
Bean, "Recent Developments in the Strained Layer Epitaxy of Germanium-Silicon Alloys", J. Vac. Sci. Technol., B4(6), Nov/Dec. 1986 pp. 1427–1429.

Primary Examiner—Olik Chaudhuri
Assistant Examiner—William Bunch
Attorney, Agent, or Firm—Joe E. Barbee; Miriam Jackson

[57] ABSTRACT

An improved method of fabricating a defect-free semiconductor layer and a semiconductor on insulator structure is provided by forming an isoelectronically doped semiconductor layer between a substrate and an semiconductor layer. The isoelectronic dopant atoms are different in atomic size than the atoms of the semiconductor material, thus misfit dislocations are created at the interface of the isoelectronically doped semiconductor layer due to lattice mismatch. Impurities and defects are not only gettered to the misfit dislocation sites, but are also prevented from propagating to the epitaxial layer. These misfit dislocations are thermally stable and are confined in a plane parallel to the interfaces of the isoelectronically doped semiconductor layer, thus very effective gettering agents. If the isoelectroncially doped semiconductor layer us also a heavily doped buried layer, no misfit dislocations are desired because the buried layer is an active device layer. In this case the isoelectronic dopant atoms may offset the non-isoelectronic dopant atoms in atomic size, thus no misfit dislocations are formed.

5 Claims, 1 Drawing Sheet

METHOD OF FORMING A DEFECT-FREE SEMICONDUCTOR LAYER ON INSULATOR

BACKGROUND OF THE INVENTION

This invention relates, in general, to semiconductor processing, and more particularly, to a method of fabricating a defect-free semiconductor layer for semiconductor device manufacture therein.

In fabricating some semiconductor devices, an epitaxial layer is typically grown on a semiconductor substrate. Several layers of epitaxy can also be grown on the silicon substrate. A semiconductor substrate is a wafer which is sliced from a semiconductor crystal or ingot. The physical properties, resistivity and thickness, of the epitaxial layer can be better controlled in the vertical direction than the properties of the substrate. Better control allows for the optimization of certain device parameters. In addition, an epitaxial layer provides a means of controlling the doping beyond that available with diffusion or ion implantation.

Growing an epitaxial layer that is free of imperfections, defects, and impurities is required to manufacture high quality semiconductor devices, as well as to improve the yield. The quality of an epitaxial layer is determined by the quality of the substrate and the epitaxial growth process itself. Defects or impurities found in the substrate will propagate from the substrate to the epitaxial layer. Impurities and defects will also be introduced into the wafer substrate and epitaxial layer during the device fabrication and may increase at each step of the wafer processing.

A large amount of defects are formed when growing epitaxial silicon on a heavily doped substrate or buried layer, because the dopant source contains a high concentration of impurities such as heavy metals. The heavy metals can diffuse rapidly into the epitaxial silicon layer and form an epitaxial haze after thermal oxidation. Defects can also be formed by the primary dopant, such as boron. Crystal defects are formed at the epitaxial/substrate or epitaxial/buried layer interface because the boron atom, being smaller than the silicon atom, causes the silicon lattice to shrink. The buried layer is an active layer, thus defects must be prevented from forming in it, as well as the epitaxial layer.

Many defects are also generated during the fabrication of Silicon On Insulator (SOI) structures formed by Separation of silicon by Implantation of Oxygen (SIMOX) method. SIMOX structures are comprised of a substrate, an insulating layer on the substrate, and a top silicon layer on the insulating layer. The insulating layer is used to electrically isolate an integrated circuit fabricated in the top silicon layer from the substrate silicon. These types of structures are typically formed by implanting a heavy dose of oxygen into a bulk silicon wafer. The oxygen reacts with the silicon to form a silicon dioxide layer during a thermal anneal. Defects, such as threading dislocations, are generated at the silicon dioxide/top silicon layer interface and propagate into the top silicon layer during thermal anneal. These defects degrade device parameters and reduce the yield.

Several methods have been used to keep impurities/defects away from the active device regions fabricated in the epitaxial layer or in the upper region of a wafer substrate. One technique, called gettering, involves forming favorable trapping sites for impurities and mobile defects and then gettering them to the trapping sites. These favorable trapping sites, or gettering agents, are formed by several methods, such as: (1) the use of damage to the crystalline lattice by lapping, sandblasting, or ion implantation of argon; (2) forming a polycrystalline layer, such as silicon nitride, or polysilicon, on the back surface of the semiconductor wafer, where a strained layer at the substrate/polycrystalline interface acts as a trapping site for impurities/defects. These gettering agents, however, are not effective because they are not stable when subjected to high temperature operations. Furthermore, there is no method reported for the gettering of defects in the top silicon layer of a SIMOX wafer.

A method to reduce the number of defects in a silicon ingot and thus improve the strength of a silicon substrate is disclosed in U.S. Pat. No. 4,631,234, issued to Larrabee on Dec. 23, 1986. Here, a high concentration of germanium atoms is added to a silicon melt during the growth of the ingot. The germanium atoms are larger than the silicon atoms, thus block the propagation and multiplication of dislocations, which are generated at the edge of wafers during high temperature wafer processing, from spreading throughout the wafer substrate. Because dislocations degrade or weaken a substrate wafer, the strength of the substrate is improved by this invention. This method, however, would not significantly prevent the formation of defects in an epitaxial layer where the substrate is isolated from the epitaxial layer by an insulating layer or a buried layer. Some degree of gettering of impurities/defects from the epitaxial silicon is provided by the aforementioned invention because a strained layer, or misfit dislocations, may exist at the epitaxial/substrate interface. However, the degree of gettering action will be very minimal because a high density of misfit dislocations can not be produced. This is due to the fact that a single crystal silicon ingot can not be easily grown when the germanium concentration is doped higher than 2 percent. A high concentration of germanium in the melt leads to a constitutional supercooling at the crystal/melt interface which prevents the growth of single crystal silicon. A low concentration of germanium, lower than 2 percent, in the substrate will not be enough to alter the lattice parameters of the substrate to form an effective strained layer that will block the propagation of defects. In addition, the aforementioned invention can not be used to form a SIMOX structure having a built-in gettering agent, since this requires the formation of silicon on an insulating layer.

By now it should be appreciated that it would be advantageous to provide a method to reduce epitaxial defects in order to improve the yield and performance of semiconductor devices.

Accordingly, it is an object of the present invention to provide an improved method of forming a defect-free epitaxial semiconductor layer by using a stable gettering agent.

Another object of the present invention is to provide a method of using misfit dislocations to prevent the propagation of defects to a semiconductor layer and to getter defects and impurities throughout the entire wafer processing cycle.

A further object of the present invention is to provide a method of reducing defects in semiconductor wafers having a heavily doped boron buried layer by preventing the formation of misfit dislocations.

Yet another object of the present invention is to provide a method of growing a defect-free semiconductor layer on a Separation by Implantation of Oxygen (SIMOX) structure.

Still another object of the present invention is to provide a method of forming SIMOX structures with reduced defects in the top silicon layer.

SUMMARY OF THE INVENTION

In accordance with the present invention, the above and other objects and advantages are provided by forming an isoelectronically doped semiconductor layer between a substrate layer and a semiconductor layer. The isoelectronically doped layer is formed by doping a semiconductor layer with isoelectronic dopant atoms of different atomic size than the atoms of the semiconductor material itself. Due to the difference in size, the semiconductor lattice is mismatched which in turn causes misfit dislocations to be formed at the interface of the substrate/isoelectronically doped semiconductor layer and the isoelectronically doped semiconductor layer/semiconductor layer. The formation of dislocations relieves the resultant strain at these interfaces. These dislocations are confined in a parallel plane adjacent the interfaces, thus other defects and impurities are blocked from propagating to the semiconductor layer. In addition, the dislocations act as stable gettering agents for defects and impurities throughout the semiconductor device processing.

In a second embodiment, the isoelectronically doped semiconductor layer may also be doped with dopant atoms which alter the conductivity type of the semiconductor layer to form a buried layer. If the isoelectronic dopant atoms offset the dopant atoms in size, the lattice will not be mismatched, and no misfit dislocations will form. It is undesirable to have misfit dislocations form in this case because the buried layer is an active part of the device.

The preferred embodiments of the invention are illustrated in the accompanying drawings for purposes of exemplification, and are not to be construed as limiting in any manner.

DETAILED DESCRIPTION OF THE DRAWINGS

Figure 1:
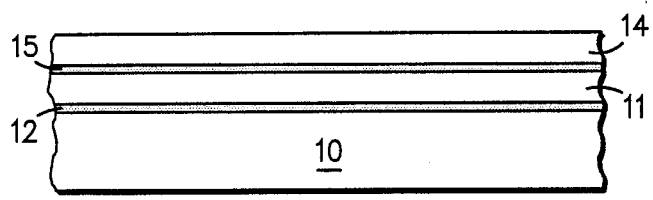
FIGS. 1-4 illustrate enlarged cross-sectional views of a small portion of structures embodying the present invention.

FIG. 1 illustrates one embodiment of the present invention. First, a semiconductor substrate 10 is provided. The semiconductor material used in the embodiments shown is preferably silicon, however, other semiconductor materials may be used. Substrate 10 can be doped either N or P type, by using boron, phosphorus, antimony, or the like. A strained layer 11 is then grown on the surface of substrate 10. Strained layer 11 is a semiconductor layer preferably formed by chemical vapor deposition (CVD), however, other deposition methods, such as molecular beam epitaxy (MBE) may also be used. An isoelectronic dopant atom having a different atomic size than the atoms of the semiconductor material should be used to dope strained layer 11. The difference in the size of the atoms causes the semiconductor lattice to be mismatched, and misfit dislocations 12 form at the interface between substrate 10 and strained layer 11. Because the dopant atoms of strained layer 11 have the same number of valence electrons as the semiconductor layer, the conductivity type of the semiconductor layer is not altered.

In a preferred embodiment, strained layer 11 is formed by CVD of silicon at a temperature of approximately 600° to 1000° C. and is doped with germanium at a concentration level of approximately 2 to 50%. A much higher concentration of dopant can be added into silicon by CVD than by introducing dopants during the growth of a silicon ingot. In the prior art, a silicon ingot could not be grown with this high of a germanium dopant concentration due to the limitation of the melt growth. In the present invention, the doping of silicon with germanium in the vapor phase can overcome this limitation. In addition, the lower the deposition temperature, the higher the concentration of dopant that can be added and still deposit a single crystal epitaxial layer. The thickness of strained layer 11 is preferably approximately 0.1 to 0.6 microns. The thickness can be smaller if a MBE process is used instead of CVD, and a thicker layer does not materially affect the operation of the present invention.

Next, an epitaxial semiconductor layer 14 is formed on the surface of strained layer 11. Misfit dislocations 15 also form at the interface between strained layer 11 and epitaxial layer 14. Epitaxial layer 14 is preferably silicon which can be doped either N or P type. Misfit dislocations 12 and 15 are confined in a plane parallel and adjacent the interfaces of strained layer 11 with substrate 10 and epitaxial layer 14, thus other defects and impurities are blocked from propagating from substrate 10 to epitaxial layer 14. Furthermore, misfit dislocations 12 and 15 are thermally stable, thus impurities and defects are gettered throughout the entire semiconductor device process cycle. Note that multiple strained layers 11 could be formed to further reduce defects in epitaxial layer 14. Multiple strained layers 11 can not be formed by using the prior art method of ingot growth.

If the structure of FIG. 1 were to be used to fabricate heterojunction bipolar devices therein, strained layer 11 would be doped of an opposite conductivity type than that of substrate layer 10 and epitaxial layer 14 to form the base of the transistors. For example, if substrate 10 is doped N type, strained layer 11 could be doped P type with boron (in addition to isoelectronic doping with germanium). Since a boron atom is smaller than a silicon atom, germanium, which is larger than silicon atom, is added to offset the boron to form a defect free layer. If the effects of the boron and the germanium offset each other strained layer 11 will not be a "strained" layer because no misfit dislocations 12 and 15 are formed. In this application it is undesirable to have any misfit dislocations form, because strained layer 11 is an active part of the device. In this embodiment, the concentration level of germanium should only be enough to offset the effects of the boron. Thus, a germanium concentration level of approximately 0.1 to 1.0% is needed.

In CMOS applications, substrate layer 10 of FIG. 1 is usually heavily doped with antimony (N type) or boron (P type) at a concentration level of approximately $1 \times 10^{18}$ atoms/cm$^3$. In heavily doped substrates, the more dopant added, the more heavy metals and other defects may be introduced. These heavy metals and other defects will migrate to the epitaxial layer grown on the heavily doped boron or antimony substrate. In the present invention, misfit dislocations 12 and 15 formed in strained layer 11 will prevent the propagation of defects to epitaxial layer 14.

Figure 2:
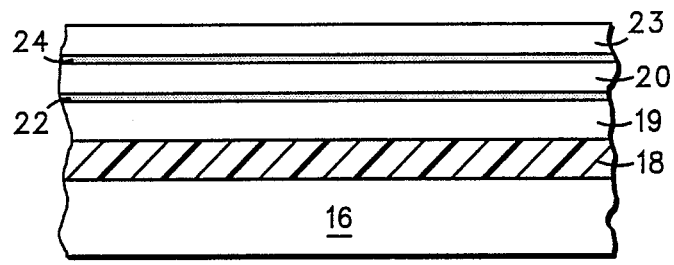

FIG. 2 illustrates a second embodiment of the present invention which provides a new method of forming a SIMOX structure with a low density of defects in a top silicon layer. First a bulk silicon wafer, which is divided into three regions 16, 18, and 19, is provided. Then a high concentration of oxygen is implanted below the surface of silicon wafer 16 which reacts to form a silicon dioxide or buried oxide layer 18. A top layer of silicon 19 does not react with the oxygen because the oxygen is implanted below layer 19. However, many defects, or threading dislocations, are formed in top silicon layer 19 when oxygen is implanted through it. A defect-free top silicon layer is desired, therefore in the present invention a strained layer 20 is formed on top silicon layer 19; dislocations 22 are formed parallel to the interface as a result. Next, an epitaxial layer 23 is formed on strained layer 20, forming misfit dislocations 24 at the interface. Thus, misfit dislocations 22 and 24 prevent any defects formed in the oxygen implantation step from propagating to epitaxial silicon layer 23. This structure has the same advantages as the structure in FIG. 1 in addition to having buried oxide layer 18 for isolating an integrated circuit from the substrate.

Figure 3:
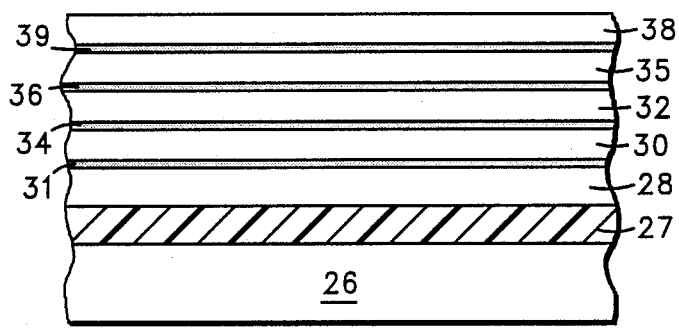

FIG. 3 illustrates a third embodiment of the present invention. The structure shown in FIG. 3 is fabricated in a similar manner as the structure of FIG. 2. FIG. 3 illustrates a structure having a substrate 26, a buried oxide layer 27, and a silicon layer 28, strained layer 30, and dislocations 31. In this embodiment, another silicon layer 32 is formed on strained layer 30, thus forming misfit dislocations 34. Another strained layer 35 is also formed, thus forming misfit dislocations 36. Next, an epitaxial layer 38 is formed on strained layer 35, forming misfit dislocations 39 at the interface. The difference between FIG. 3 and FIG. 2 is the additional layers of silicon 32 and strained layer 35. These layers create an additional set of misfit dislocations 36 and 39 to prevent the propagation of defects to epitaxial layer 38. Multiple silicon and strained layers could be added as necessary to provide for an epitaxial layer which is defect free.

Figure 4:
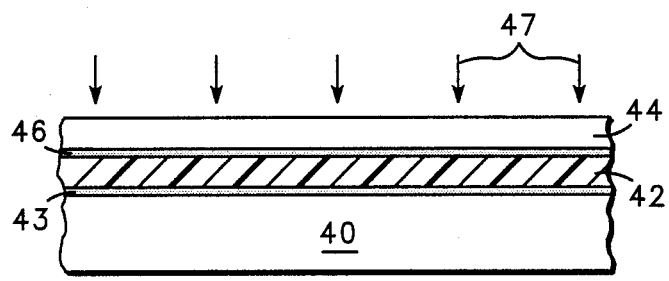

FIG. 4 illustrates a fourth embodiment of the present invention which provides another method of reducing the number of defects in a SIMOX structure by oxygen implantation into a strained layer. Illustrated is a substrate 40, strained layer 42, misfit dislocations 43, epitaxial silicon layer 44 and misfit dislocations 46, formed in the same manner as FIG. 1. Next, a heavy dose of oxygen, illustrated by arrows 47, is implanted into strained layer 42. The oxygen is implanted at an energy which allows the peak concentration of oxygen dopant to be placed in strained layer 42. Strained layer 42, preferably germanium doped silicon, is thus transformed into a mixture of germanium dioxide and silicon dioxide. This mixed dioxide layer 42 acts as an isolation layer in addition to a strained layer. In the present invention, the dislocations formed by the ion implantation of oxygen are prevented from propagating to semiconductor layer 44 by misfit dislocations 46. Dislocations 43 prevent the propagation of defects from substrate layer 40 to strained layer 42 and semiconductor layer 44.

By now it should be appreciated that there has been provided a new and improved method of reducing the number of defects in a semiconductor layer and in a SIMOX structure by using a strained layer.

I claim:

1. A method of fabricating a defect-free semiconductor layer, comprising the steps of:
   providing a semiconductor substrate;
   forming a strained semiconductor layer on the substrate by adding isoelectronic dopant atoms of a different atomic size than atoms of the semiconductor, which produces misfit dislocations between the semiconductor substrate and the strained semiconductor layer;
   forming a semiconductor layer on the strained semiconductor layer which produces misfit dislocations between the strained semiconductor layer and the semiconductor layer; and
   implanting oxygen into the strained layer to create a mixed oxide layer which acts as an insulator.

2. A method of fabricating a low defect silicon on insulator structure, comprising the steps of:
   providing a silicon substrate;
   forming a germanium doped silicon layer on the substrate;
   forming a silicon layer on the germanium doped silicon layer; and
   implanting oxygen into the germanium doped silicon layer, thus transforming the germanium doped silicon layer into creating a mixed silicon dioxide and germanium dioxide layer.

3. A method of fabricating a defect-free semiconductor layer, comprising the steps of:
   providing a semiconductor substrate;
   forming a first semiconductor layer on the substrate, wherein the first semiconductor layer is doped with isoelectronic dopant atoms of a different size than atoms of the first semiconductor layer;
   forming a second semiconductor layer on the first semiconductor layer, wherein isoelectronic dopant atoms create misfit dislocations between the semiconductor substrate and the first semiconductor layer and between the first semiconductor layer and the second semiconductor layer; and
   implanting oxygen into the first semiconductor layer after forming the second semiconductor layer, thus transforming the first semiconductor layer into a mixed oxide layer.

4. A method of fabricating a low defect semiconductor layer having an insulating layer, comprising the steps of:
   providing a structure having a semiconductor substrate layer, an insulating layer on the substrate layer, and a first semiconductor layer on the insulating layer;
   forming a first strained semiconductor layer on the first semiconductor layer by adding isoelectronic dopant atoms of a different size than atoms of the semiconductor layer which produces misfit dislocations between the first semiconductor layer and the first strained semiconductor layer; and
   forming a second semiconductor layer on the first strained layer which produces misfit dislocations between the first strained semiconductor layer and the second semiconductor layer.

5. The method of claim 4 further comprising the step of forming at least one more combination of a semiconductor layer and a strained semiconductor layer in between the first strained semiconductor layer and the second semiconductor layer.

* * * * *